(12) United States Patent
Chen et al.

(10) Patent No.: US 10,416,506 B2
(45) Date of Patent: Sep. 17, 2019

(54) ARRAY SUBSTRATE AND METHOD OF FABRICATING THE ARRAY SUBSTRATE

(71) Applicant: Shenzhen China Star Optoelectronics Technology Co., Ltd., Shenzhen, Guangdong (CN)

(72) Inventors: Xingwu Chen, Guangdong (CN); Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/547,580

(22) PCT Filed: Jun. 15, 2017

(86) PCT No.: PCT/CN2017/088379
§ 371 (c)(1),
(2) Date: Jul. 31, 2017

(87) PCT Pub. No.: WO2018/184293
PCT Pub. Date: Oct. 11, 2018

(65) Prior Publication Data
US 2018/0292718 A1    Oct. 11, 2018

(30) Foreign Application Priority Data

Apr. 6, 2017    (CN) .......................... 2017 1 0227135

(51) Int. Cl.
*H01L 27/14*    (2006.01)
*H01L 29/04*    (2006.01)
(Continued)

(52) U.S. Cl.
CPC ...... *G02F 1/134363* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

2002/0089631 A1*    7/2002    Lee ................... G02F 1/134363
                                                       349/141
2014/0085557 A1*    3/2014    Kim .................. G02F 1/134309
                                                       349/43

FOREIGN PATENT DOCUMENTS

| CN | 105404062 A | 3/2016 |
| CN | 106066559 A | 11/2016 |
| CN | 106842728 A | 6/2017 |

* cited by examiner

*Primary Examiner* — Calvin Y Choi
(74) *Attorney, Agent, or Firm* — Andrew C. Cheng

(57) ABSTRACT

The present application discloses an array substrate, including a substrate; a thin film transistor disposed on the substrate; a pixel electrode disposed on the substrate and is in contact with a drain electrode of the thin film transistor; a common electrode disposed above the pixel electrode and is electrically insulated from the pixel electrode, and the common electrode has a plurality of first through holes. The present application further discloses a method of fabricating the array substrate. The array substrate and the fabricating method of the present application can reduce the parasitic capacitance between the common electrode and the pixel electrode, and can accelerate the release of the aggregated ions. In addition, the present application, by forming a stereoscopic electrode structure, the lateral electric field can be effectively enhanced, so that the driving voltage can be reduced, the display transmittance can be improved, and the power consumption can be reduced.

8 Claims, 8 Drawing Sheets

(51) Int. Cl.
*H01L 29/15* (2006.01)
*H01L 31/036* (2006.01)
*G02F 1/1343* (2006.01)
*G02F 1/1333* (2006.01)
*H01L 27/12* (2006.01)
*G02F 1/1368* (2006.01)
*G02F 1/136* (2006.01)

(52) U.S. Cl.
CPC .... *G02F 1/133345* (2013.01); *H01L 27/1262* (2013.01); *G02F 2001/13606* (2013.01); *G02F 2001/133397* (2013.01); *G02F 2001/134318* (2013.01); *G02F 2001/134372* (2013.01)

ARRAY SUBSTRATE AND METHOD OF FABRICATING THE ARRAY SUBSTRATE

FIELD OF THE INVENTION

The present application relates to a display technology field, and more particularly to an array substrate and a method of fabricating the array substrate.

BACKGROUND OF THE INVENTION

With the rapid development of display technology, liquid crystal display technology has become the most widely used display technology. In addition, the demand for display technology is getting higher and higher, such as the large perspective, high penetration and high reliability and so higher requirements is presented.

At present, the commonly used liquid crystal displays are Twist Nematic, TN mode, Vertical Alignment, VA mode, In-plane switching, IPS mode and Fringe Field Switching, FFS mode. Among them, the FFS model draws much attention, due to its wide viewing angle, high penetration and hard screen technology. However, the FFS model still has some shortcomings, the most important of which is image sticking, IS phenomenon, that is, the phenomenon of still visible of the previous image, after displaying the same image for a long time and switching to the next image.

The root causes of generating the IS phenomenon is a lot, the most important reason is due to ion aggregation cannot be released in time by the long-term driving, and the parasitic capacitance is too large and lead to the symmetry of the common voltage (Vcom) getting worse.

SUMMARY OF THE INVENTION

In order to solve the above-mentioned problems of the conventional technology, the object of the present application is to provide an array substrate and a method of fabricating the same to be capable of releasing the aggregated ions rapidly and reducing the parasitic capacitance.

According to an aspect of the present application, an array substrate is provided, and the array substrate including: a substrate; a thin film transistor disposed on the substrate; a pixel electrode disposed on the substrate and is in contact with a drain electrode of the thin film transistor; a common electrode disposed above the pixel electrode and is electrically insulated from the pixel electrode, and the common electrode has a plurality of first through holes.

Alternatively, the array substrate further including a passivation layer, the passivation layer is provided on the thin film transistor and below the pixel electrode, and the passivation layer below the pixel electrode has a plurality of protrusions, and the pixel electrode has a plurality of second through holes and the protrusions pass through the corresponding second through holes.

Alternatively, the common electrode is disposed on the projections and the first through hole is located between the corresponding adjacent two projections.

Alternatively, the transistor including: a gate electrode disposed on the substrate; a gate insulating layer disposed on the substrate and the gate electrode; an active layer disposed on the gate insulating layer; a first N-type conductive layer and a second N-type conductive layer disposed on the active layer and spaced apart from each other; a source electrode and the drain electrode disposed on the first N-type conductive layer and the second N-type conductive layer, respectively, the source electrode and the drain electrode are in contact with the active layer, and the source electrode and the drain electrode are extending to the gate insulating layer, respectively; wherein the pixel electrode is located on the gate insulating layer of the substrate, and the passivation layer on the substrate is located between the pixel electrode and the gate insulating layer on the substrate.

Alternatively, the transistor including: a gate electrode disposed on the substrate; a gate insulating layer disposed on the substrate and the gate electrode; an active layer disposed on the gate insulating layer; a first N-type conductive layer and a second N-type conductive layer disposed on the active layer and spaced apart from each other; a source electrode and the drain electrode disposed on the first N-type conductive layer and the second N-type conductive layer, respectively, the source electrode and the drain electrode are in contact with the active layer, and the source electrode and the drain electrode are extending to the gate insulating layer, respectively; wherein the pixel electrode is located on the gate insulating layer of the substrate, and the passivation layer on the substrate is located between the pixel electrode and the gate insulating layer on the substrate.

Alternatively, the array substrate further including a passivation layer, the passivation layer is disposed on the thin film transistor and on the pixel electrode, and the passivation layer on the pixel electrode has a plurality of protrusions, the common electrode is disposed on the protrusions, and the and the first through hole is located between the corresponding adjacent two projections.

Alternatively, the transistor including: a gate electrode disposed on the substrate; a gate insulating layer disposed on the substrate and the gate electrode; an active layer disposed on the gate insulating layer; a first N-type conductive layer and a second N-type conductive layer disposed on the active layer and spaced apart from each other; a source electrode and the drain electrode disposed on the first N-type conductive layer and the second N-type conductive layer, respectively, the source electrode and the drain electrode are in contact with the active layer, and the source electrode and the drain electrode are extending to the gate insulating layer, respectively; wherein the pixel electrode on the substrate is located on the gate insulating layer of the substrate.

According to an aspect of the present application, a method of fabricating an array substrate is provided, including: providing a substrate; forming a thin film transistor on the substrate; forming a first passivation layer on the thin film transistor and the substrate; forming a via in the first passivation layer to expose a drain electrode of the thin film transistor; forming a pixel electrode having a plurality of first through holes on the first passivation layer on the substrate, wherein the pixel electrode is in contact with a drain electrode of the thin film transistor by the via; forming a second passivation layer on the first passivation layer and the pixel electrode, and the second passivation layer fills the first through hole; forming a common electrode having a plurality of second through holes on the second passivation layer on the pixel electrode, and the first through hole and the second through hole is staggered disposed; etching and removing the second passivation layer on the thin film transistor and the second passivation layer exposed by the second through hole.

Alternatively, the method of forming the thin film transistor on the substrate including: forming a gate electrode on the substrate; forming a gate insulating layer on the substrate and the gate electrode; wherein the first passivation layer on the substrate is located on the gate insulating layer of the substrate; forming an active layer on the gate insulating layer on the gate electrode; forming a first N-type conductive layer and a second N-type conductive layer on the active layer and to be spaced from each other; forming a source electrode and the drain electrode on the first N-type conductive layer and the second N-type conductive layer respectively, the source electrode and the drain electrode are in contact with the active layer, and the source electrode and the drain electrode are both extending to the gate insulating layer, respectively.

According to an aspect of the present application, a method of fabricating an array substrate is provided, including: providing a substrate; forming a thin film transistor on the substrate; forming a pixel electrode on the substrate, wherein the pixel electrode is in contact with a drain electrode of the thin film transistor; forming a passivation layer on the thin film transistor and the pixel electrode; forming a common electrode having a plurality of through holes on the passivation layer on the pixel electrode; etching and removing a portion of the passivation layer on the thin film transistor and a portion of the passivation layer exposed by the second through hole.

Alternatively, the method of forming the thin film transistor on the substrate including: forming a gate electrode on the substrate; forming a gate insulating layer on the substrate and the gate electrode; wherein the pixel electrode on the substrate is located on the gate insulating layer of the substrate; forming an active layer on the gate insulating layer on the gate electrode; forming a first N-type conductive layer and a second N-type conductive layer on the active layer and to be spaced from each other; forming a source electrode and the drain electrode on the first N-type conductive layer and the second N-type conductive layer respectively, the source electrode and the drain electrode are in contact with the active layer, and the source electrode and the drain electrode are both extending to the gate insulating layer, respectively.

The advantageous effects of the present application: the array substrate and the method of fabricating the same of the present application can reduce the parasitic capacitance between the common electrode and the pixel electrode, and can accelerate the release of the aggregated ions. In addition, the present application can effectively enhance the lateral electric field by forming a stereoscopic electrode structure, so that the driving voltage can be reduced, the display transmittance can be improved, and the power consumption can be reduced.

BRIEF DESCRIPTION OF THE DRAWINGS

In order to more clearly illustrate the embodiments of the present application or prior art, the following FIGS. will be described in the embodiments are briefly introduced. It is obvious that the drawings are merely some embodiments of the present application, those of ordinary skill in this field can obtain other FIGS. according to these FIGS. without paying the premise.

DETAILED DESCRIPTION OF PREFERRED EMBODIMENTS

Figure 1:
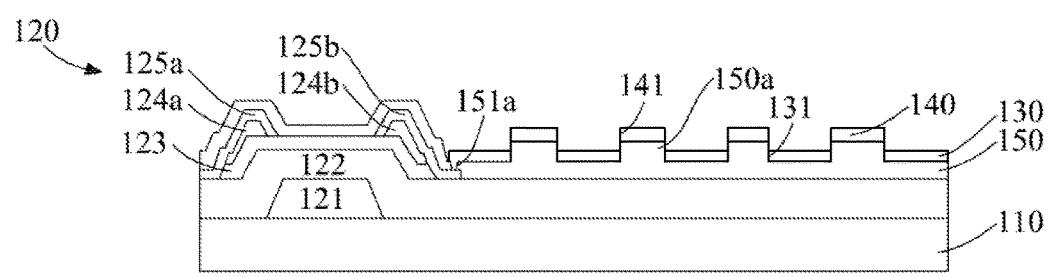
FIG. 1 is a schematic structural view of an array substrate according to a first embodiment of the present application.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

In the drawings, the thickness of the layers and regions is exaggerated in order to clarify the device. The same reference numerals denote the same elements throughout the drawings. It will also be understood that when an element is referred to as being "over" or "upper" on another element, it can be disposed directly on the other element, or an intermediate element can also be present.

FIG. 1 is a schematic structural view of an array substrate according to a first embodiment of the present application.

Referring to FIG. 1, the array substrate according to the first embodiment of the present application includes a substrate 110, a thin film transistor 120, a pixel electrode 130, and a common electrode 140.

The substrate 110 can be, for example, a transparent glass substrate and a resin substrate. The thin film transistor 120 is formed on the substrate 110. The pixel electrode 130 is formed on the substrate 110, and further, the pixel electrode 130 is formed on the substrate 110 in a region other than the region occupied by the thin film transistor 120, and the pixel electrode 130 is in contact with a drain electrode of the thin film transistor 120. The common electrode 140 is disposed above the pixel electrode 130, and the common electrode 140 and the pixel electrode 130 are electrically insulated from each other, and the common electrode 140 has a plurality of first through holes 141.

Thus, by forming the first through hole 141 in the common electrode 140, the overlapping area between the common electrode 140 and the pixel electrode 130 is reduced, so that the parasitic capacitance between the common electrode 140 and the pixel electrode 130 is reduced.

Further, the pixel electrode 130 has a plurality of second through holes 131 in which the first through hole 141 and the second through hole 131 are staggered disposed, that is, each of the first through holes 141 is disposed between the corresponding adjacent two second through-hole 131. In this way, the overlapping area between the common electrode 140 and the pixel electrode 130 can be further reduced, thereby further reducing the parasitic capacitance between the common electrode 140 and the pixel electrode 130.

In the present embodiment, in order to realize the above-described structure of the common electrode 140 and the pixel electrode 130, the array substrate according to the first embodiment of the present application further includes a passivation layer 150 provided on the thin film transistor 120 and below the pixel electrode 130, and the passivation layer 150 below the pixel electrode 130 has a plurality of protrusions 150a, each of the protrusions 150a pass through the corresponding second through holes 131, so that the top surface of the projections 150a is higher than the top surface of the pixel electrode 130, and the common electrode 140 is provided on the projection 150a.

In addition, the thin film transistor 120 includes a gate electrode 121 provided on the substrate 110, a gate insulating layer 122 provided on the substrate 110 and the gate electrode 121, an active layer 123 provided on the gate insulating layer 122 of the gate electrode 121; a first N-type conductive layer 124a and a second N-type conductive layer 124b are formed on the active layer 123 and spaced apart from each other; a source electrode 125a and the drain electrode 125b are provided on the first N-type conductive layer 124a and the second N-type conductive layer 125b, respectively, the source electrode 125a and the drain electrode 125b are both in contact with the active layer 123, and the source electrode 125a and the drain electrode 125b are extended to the gate insulating layer 122, respectively; wherein the pixel electrode 130 is located on the gate insulating layer 122 of the substrate 110, and the passivation layer 150 is located between the pixel electrode 130 and the gate insulating layer 122 on the substrate 110. Further, the pixel electrode 130 is connected and in contact with the drain electrode 125b by the via 151a in the passivation layer 150.

A structural example of the thin film transistor 120 is described above, the present application is not limited thereto. In addition, the active layer 123 is made of amorphous silicon, a-Si, but the present application is not limited thereto. The first N-type conductive layer 124a and the second N-type conductive layer 124b are made of N-type doped silicon, n+Si, but the present application is not limited thereto.

Further, the passivation layer 150 is made of a material having a low dielectric constant, and for example, the passivation layer 150 can be made of an acrylic resin, an epoxy resin, a polyfunctional polymerizable monomer, a photoinitiator, a tackifier and polyvinyl alcohol, and the like to be mixed and dissolved into a solvent, and the solvent can be propylene glycol methyl ether acetate, PGMEA, ethoxydiethylene glycol, EDG, and the like. Here, by forming the passivation layer 150 with a material having a low dielectric constant, it is possible to further reduce the parasitic capacitance between the common electrode 140 and the pixel electrode 130, and to accelerate the release of the accumulated ions, thereby reducing the ionization DC residual caused by the ions accumulation.

FIGS. 2A to 2L show the fabricating process flow of the array substrate according to the first embodiment of the present application.

Figure 2A:
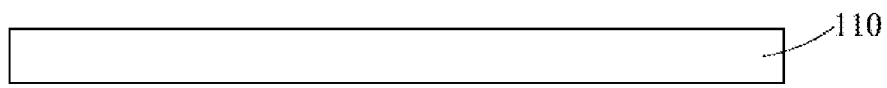
FIGS. 2A to 2L show the fabricating process flow of the array substrate according to the first embodiment of the present application.

A method of fabricating an array substrate according to the first embodiment of the present application includes:

Step 1: Referring to FIG. 2A, providing a substrate 110. The substrate 110 can be, for example, a transparent glass substrate and a resin substrate.

Figure 2B:
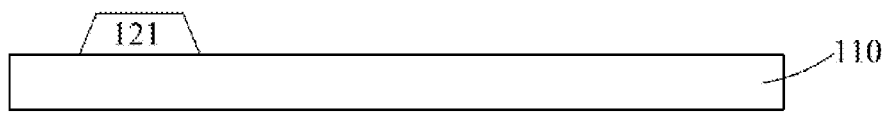

Step 2: Referring to FIG. 2B, forming a gate electrode 121 on the substrate 110. The gate electrode 121 can be made of a conductive metal.

Figure 2C:
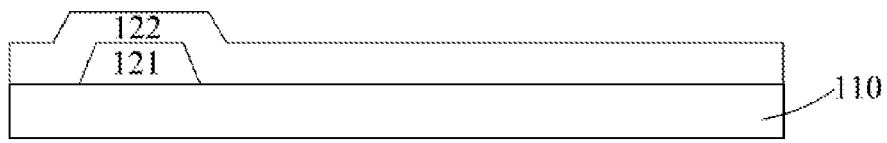

Step 3: Referring to FIG. 2C, forming a gate insulating layer 122 on the substrate 110 and the gate electrode 121. The gate insulating layer 122 can be made of an insulating material such as SiOx or SiNx.

Figure 2D:
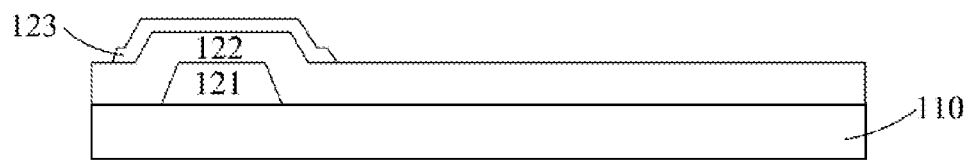

Step 4: Referring to FIG. 2D, forming the active layer 123 on the gate insulating layer 122, wherein the active layer 123 is opposed to the gate electrode 121. The active layer 123 is made of amorphous silicon, a-Si, but the present application is not limited thereto.

Figure 2E:
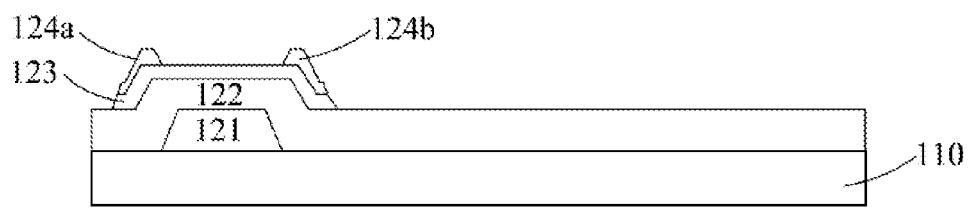

Step 5: Referring to FIG. 2E, forming a first N-type conductive layer 124a and a second N-type conductive layer 124b on the active layer 123 and to be spaced from each other. The first N-type conductive layer 124a and the second N-type conductive layer 124b are made of N-type doped silicon, n+Si, but the present application is not limited thereto.

Figure 2F:
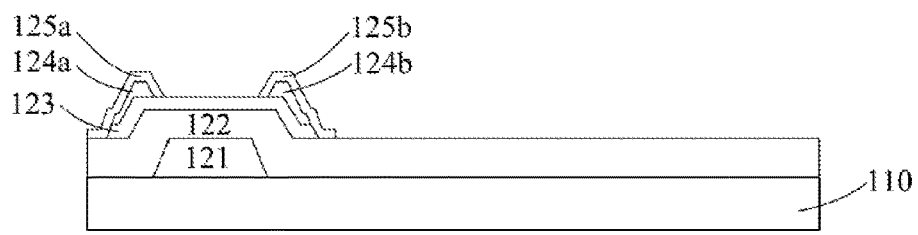

Step 6: Referring to FIG. 2F, forming the source electrode 125a and the drain electrode 125b on the first N-type conductive layer 124a and the second N-type conductive layer 124b respectively, and the source electrode 125a and the drain electrode 125b are both in contact with the active layer 123, and the source electrode 125a and the drain electrode 125b are both extending to the gate insulating layer 122, respectively.

Here, the fabrication of the thin film transistor 120 is completed by performing steps 2 to 6.

Figure 2G:
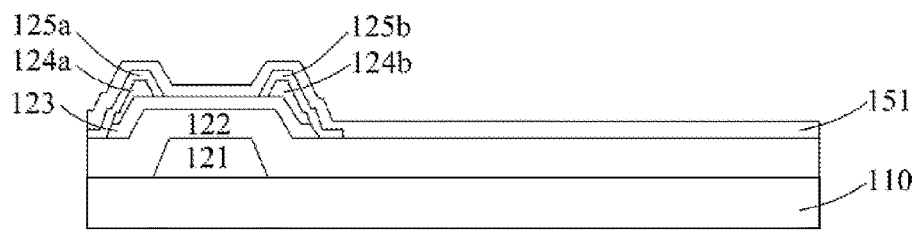

Step 7: Referring to FIG. 2G, forming a first passivation layer 151 on the gate insulating layer 122 of the thin film transistor 120 and on the substrate 110. The first passivation layer 151 can be made of a material having a low dielectric constant.

Figure 2H:
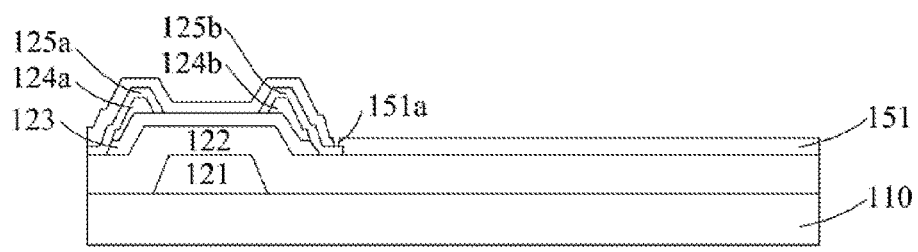

Step 8: Referring to FIG. 2H, forming a via 151a in the first passivation layer 151 to expose the drain electrode 125b.

Figure 2I:
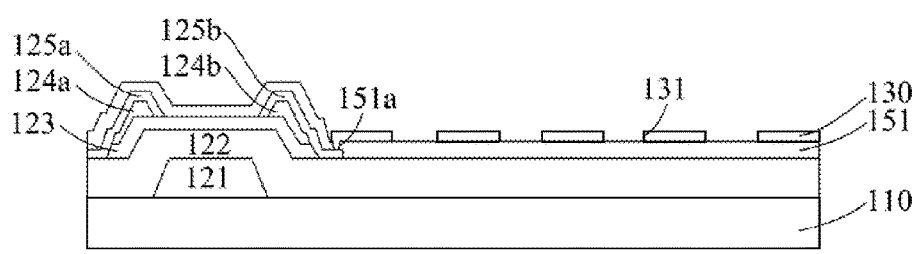

Step 9: Referring to FIG. 2I, forming a pixel electrode 130 having a plurality of second through holes 131 on the first passivation layer 151 on the substrate 110, wherein the pixel electrode 130 fills the via 151a to contact with the drain electrode 125b.

Figure 2J:
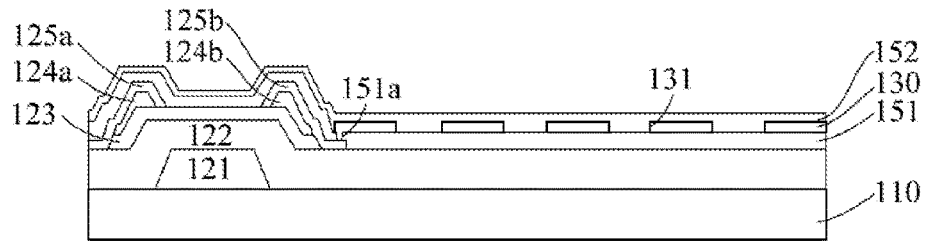

Step 10: Referring to FIG. 2J, forming a second passivation layer 152 on the first passivation layer 151 and the pixel electrode 130, and the second passivation layer 152 fills the second through hole 131. Here, the first passivation layer 151 and the second passivation layer 152 will constitute the structure of the passivation layer 150 illustrated in FIG. 1, and the detail can be referred to the following description.

Figure 2K:
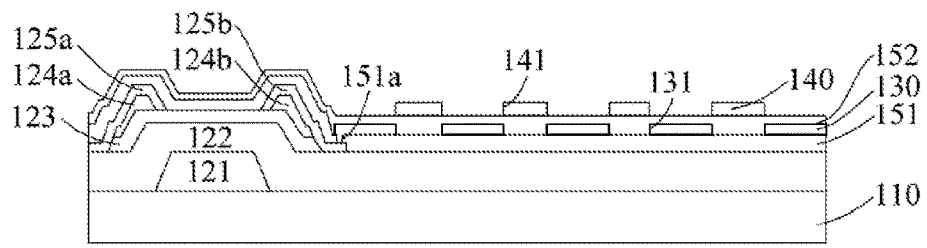

Step 11: Referring to FIG. 2K, forming a common electrode 140 having a plurality of second through holes 141 on the second passivation layer 152 on the pixel electrode 130, and the first through hole 131 and the second through hole 141 is staggered disposed.

Figure 2L:
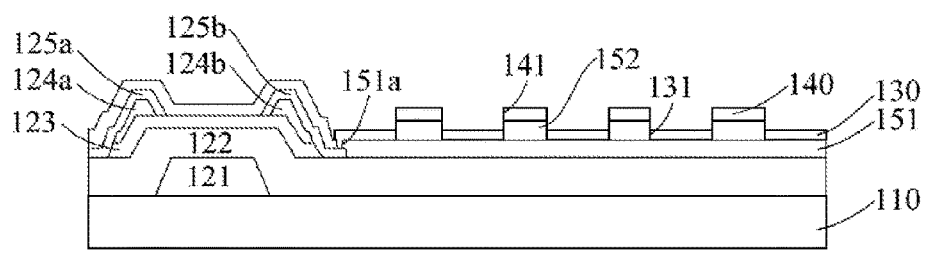

Step 12: Referring to FIG. 2L, etching and removing the second passivation layer 152 on the thin film transistor 120 and the second passivation layer 152 exposed by the second through hole 141. Thus, the first passivation layer 151 and the remaining second passivation layer 152 form the structure of the passivation layer 150 illustrated in FIG. 1.

By the fabrication process of the array substrate according to the first embodiment of the present application, by etching the second passivation layer 152, the pixel electrode 130 and the common electrode 140 are exposed at the same time, and making the aggregated ions released rapidly.

In addition, by the array substrate and the fabricating method thereof according to the first embodiment of the present application, by etching the second passivation layer 152, a stereoscopic electrode structure can be formed (i.e., the vertically formed pixel electrode 130 and the common electrode 140), it can enhance the lateral electric field effectively, therefore the driving voltage can be reduced, the display transmittance can be improved, and the power consumption can be reduced.

Figure 3:
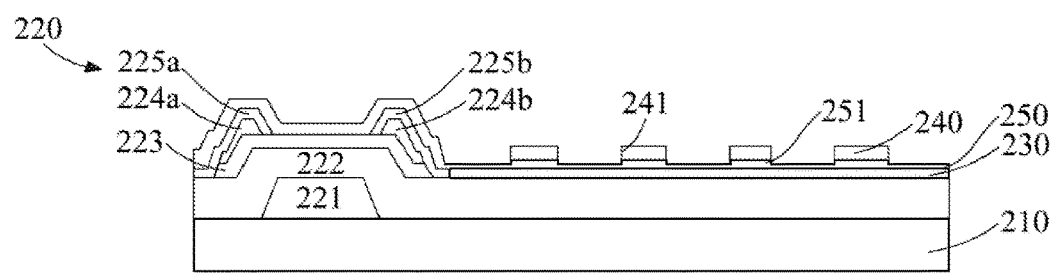
FIG. 3 is a schematic structural view of an array substrate according to a second embodiment of the present application.

FIG. 3 is a schematic structural view of an array substrate according to a second embodiment of the present application.

Referring to FIG. 3, an array substrate according to a second embodiment of the present application includes a substrate 210, a thin film transistor 220, a pixel electrode 230, and a common electrode 240.

The substrate 210 can be, for example, a transparent glass substrate and a resin substrate. The thin film transistor 220 is formed on the substrate 210. Further, the pixel electrode 230 is formed on the substrate 110 in a region other than the region occupied by the thin film transistor 220, and the pixel electrode 230 is in contact with a drain electrode of the thin film transistor 220. The common electrode 240 is disposed above the pixel electrode 230, and the common electrode 240 and the pixel electrode 230 are electrically insulated from each other, and the common electrode 240 has a plurality of third through holes 241.

In this way, by forming the third through hole 241 in the common electrode 240, the overlapping area between the common electrode 240 and the pixel electrode 230 is reduced, thereby reducing the parasitic capacitance between the common electrode 240 and the pixel electrode 230.

In the present embodiment, in order to realize the above-described structure of the common electrode 240 and the pixel electrode 230, the array substrate according to the second embodiment of the present application further includes: a passivation layer 250, the passivation layer 250 is disposed on the thin film transistor 220 and the pixel electrode 230, and the passivation layer 250 on the pixel electrode 130 has a plurality of protrusions 251, the common electrode 240 is disposed on the projection 251, and the third through hole 241 is staggered disposed with the projection 251, such as the third through hole 241 is located between the corresponding adjacent two projections 251.

In addition, the thin film transistor 220 includes: a gate electrode 221 provided on the substrate 210, a gate insulating layer 222 provided on the substrate 210 and the gate electrode 221, an active layer 223 disposed on the gate insulating layer 222 on the gate electrode 221. The first N-type conductive layer 224a and the second N-type conductive layer 224b disposed on the active layer 223 and are spaced apart from each other; the source electrode 225a and the drain electrode 225b are provided on the first N-type conductive layer 224a and the second N-type electrode layer 224b, respectively, and the source electrode 225a and the drain electrode 225b are both in contact with the active layer 223, and the source electrode 225a and the drain electrode 225b are extended to the gate insulating layer 222, respectively, wherein the pixel electrode 230 is located on the gate insulating layer 222 of the substrate 210.

In the above, a structural example of the thin film transistor 220 has been described, but the present application is not limited thereto. In addition, the active layer 223 is made of amorphous silicon, a-Si, but the present application is not limited thereto. The first N-type conductive layer 224a and the second N-type conductive layer 224b are both made of N-type doped silicon, n+Si, but the present application is not limited thereto.

Further, the passivation layer 250 is made of a material having a low dielectric constant, the passivation layer 250 can be made of an acrylic resin, an epoxy resin, a polyfunctional polymerizable monomer, a photoinitiator, a tackifier and polyvinyl alcohol, and the like to be mixed and dissolved into a solvent, and the solvent can be propylene glycol methyl ether acetate, PGMEA, ethoxydiethylene glycol, EDG, and the like. Here, by forming the passivation layer 250 with a material having a low dielectric constant, it is possible to further reduce the parasitic capacitance between the common electrode 240 and the pixel electrode 230, and to accelerate the release of the accumulated ions, thereby reducing the ionization DC residual caused by the ions accumulation.

FIGS. 4A to 4J show the fabricating process flow of the array substrate according to the second embodiment of the present application.

Figure 4A:
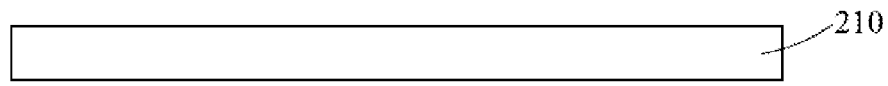
FIGS. 4A to 4J show the fabricating process flow of the array substrate according to the second embodiment of the present application.

A method of fabricating an array substrate according to a second embodiment of the present application includes:

Step 1: Referring to FIG. 4A, providing a substrate 210. The substrate 210 can be, for example, a transparent glass substrate and a resin substrate.

Figure 4B:
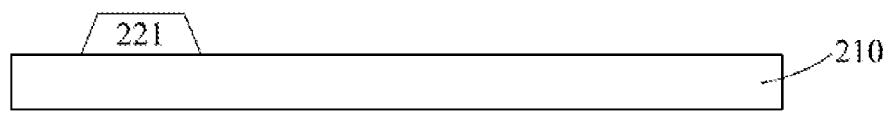

Step 2: Referring to FIG. 4B, forming a gate 221 on the substrate 210. The gate electrode 221 can be made of a conductive metal.

Figure 4C:
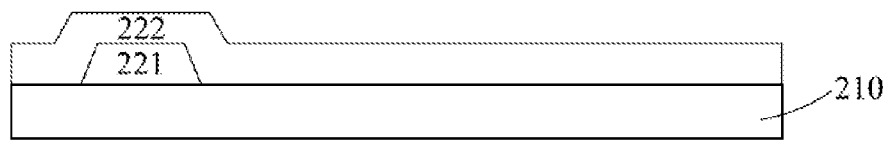

Step 3: Referring to FIG. 4C, forming a gate insulating layer 222 on the substrate 210 and the gate electrode 221. The gate insulating layer 222 can be made of an insulating material such as SiOx or SiNx.

Figure 4D:
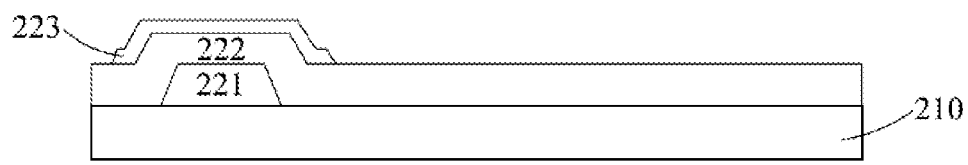

Step 4: Referring to FIG. 4D, forming an active layer 223 on the gate insulating layer 222, wherein the active layer 223 is opposed to the gate electrode 221. The active layer 223 is made of amorphous silicon, a-Si, but the present application is not limited thereto.

Figure 4E:
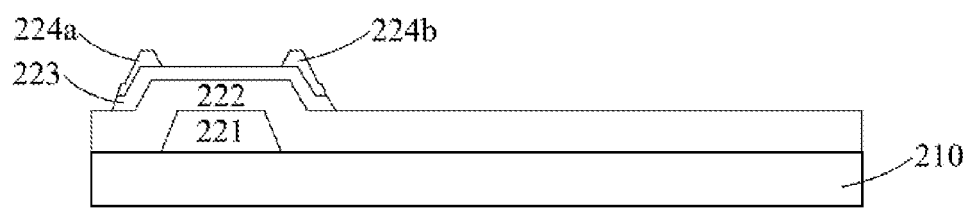

Step 5: Referring to FIG. 4E, forming a first N-type conductive layer 224a and a second N-type conductive layer 224b on the active layer 223 so as to be spaced from each other. The first N-type conductive layer 224a and the second N-type conductive layer 224b are made of N-type doped silicon, n+Si, but the present application is not limited thereto.

Figure 4F:
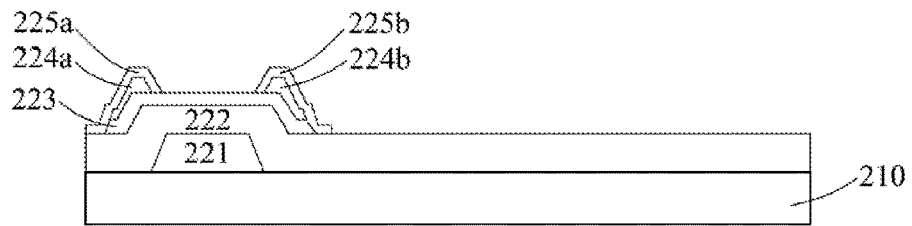

Step 6: Referring to FIG. 4F, forming the source electrode 225a and the drain electrode 225b on the first N-type conductive layer 224a and the second N-type conductive layer 224b respectively, and the source electrode 225a and the drain electrode 225b are both in contact with the active layer 223, and the source electrode 225a and the drain electrode 225b are extending to the gate insulating layer 222, respectively.

Here, the fabrication of the thin film transistor 220 is completed by performing steps 2 to 6.

Figure 4G:
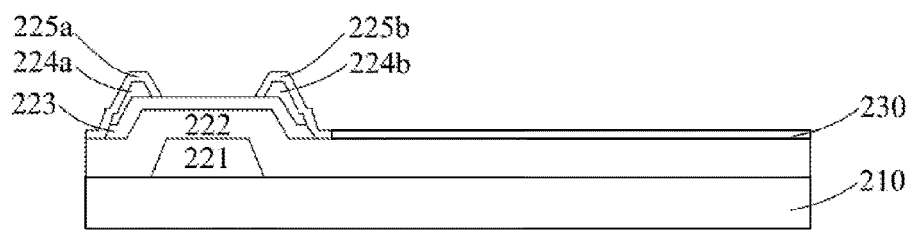

Step 7: Referring to FIG. 4G, forming the pixel electrode 230 on the gate insulating layer 222 on the substrate 210.

Figure 4H:
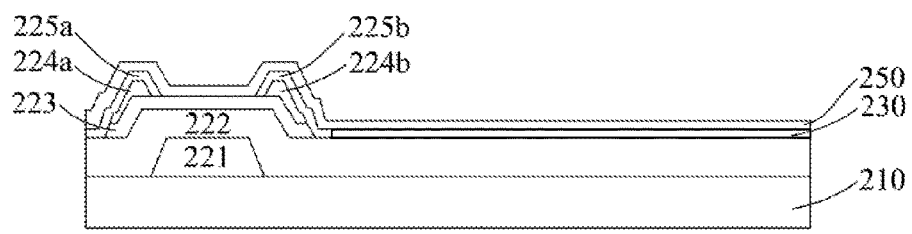

Step 8: Referring to FIG. 4H, forming the passivation layer 250 on the thin film transistor 220 and the pixel electrode 230. The passivation layer 250 can be made of a material having a low dielectric constant.

Figure 4I:
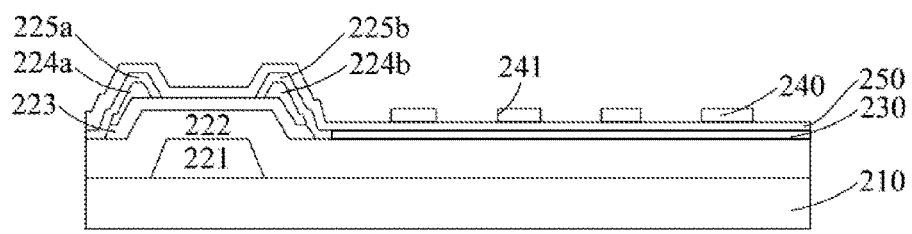

Step 9: Referring to FIG. 4I, forming a common electrode 240 having a plurality of third through holes 241 on the passivation layer 250 on the pixel electrode 230.

Figure 4J:
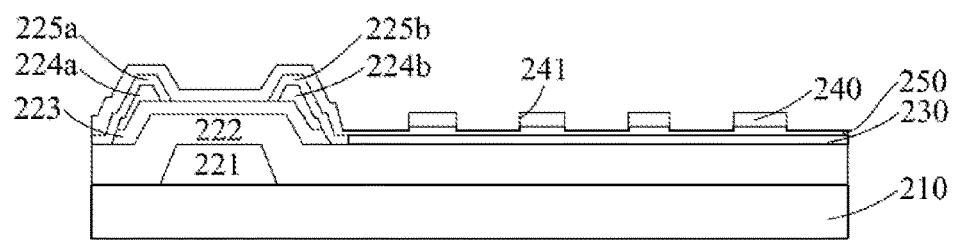

Step 10: Referring to FIG. 4J, etching and removing a portion of the passivation layer 250 on the thin film transistor 220 and a portion of the passivation layer 250 exposed by the third through hole 241.

By the array substrate and the fabricating method according to the second embodiment of the present application, by etching the passivation layer 250, a stereoscopic electrode structure can be formed (i.e., the vertically formed pixel electrode 230 and the common electrode 240), it can enhance the lateral electric field effectively, therefore the driving voltage can be reduced, the display transmittance can be improved, and the power consumption can be reduced.

Above are embodiments of the present application, which does not limit the scope of the present application. Any modifications, equivalent replacements or improvements within the spirit and principles of the embodiment described above should be covered by the protected scope of the invention.

What is claimed is:
1. An array substrate, comprising:
a substrate;
a thin film transistor disposed on the substrate;

a pixel electrode disposed on the substrate and is in contact with a drain electrode of the thin film transistor; and a common electrode disposed above the pixel electrode and is electrically insulated from the pixel electrode, and the common electrode has a plurality of first through holes, wherein the array substrate further comprising a passivation layer, the passivation layer is provided on the thin film transistor and below the pixel electrode, and the passivation layer below the pixel electrode has a plurality of protrusions, and the pixel electrode has a plurality of second through holes and the protrusions pass through the corresponding second through holes, wherein the common electrode is disposed on the protrusions, and the common electrode is contacted with and not covered by the protrusions.

2. The array substrate according to claim 1, wherein the first through hole is located between the corresponding adjacent two projections.

3. The array substrate according to claim 1, wherein the transistor comprising:
a gate electrode disposed on the substrate;
a gate insulating layer disposed on the substrate and the gate electrode;
an active layer disposed on the gate insulating layer;
a first N-type conductive layer and a second N-type conductive layer disposed on the active layer and spaced apart from each other;
a source electrode and the drain electrode disposed on the first N-type conductive layer and the second N-type conductive layer, respectively, the source electrode and the drain electrode are in contact with the active layer, and the source electrode and the drain electrode are extending to the gate insulating layer, respectively; and
wherein the pixel electrode is located on the gate insulating layer of the substrate, and the passivation layer on the substrate is located between the pixel electrode and the gate insulating layer on the substrate.

4. The array substrate according to claim 2, wherein the transistor comprising:
a gate electrode disposed on the substrate;
a gate insulating layer disposed on the substrate and the gate electrode;
an active layer disposed on the gate insulating layer;
a first N-type conductive layer and a second N-type conductive layer disposed on the active layer and spaced apart from each other;
a source electrode and the drain electrode disposed on the first N-type conductive layer and the second N-type conductive layer, respectively, the source electrode and the drain electrode are in contact with the active layer, and the source electrode and the drain electrode are extending to the gate insulating layer, respectively; and
wherein the pixel electrode is located on the gate insulating layer of the substrate, and the passivation layer on the substrate is located between the pixel electrode and the gate insulating layer on the substrate.

5. A method of fabricating an array substrate, comprising:
providing a substrate;
forming a thin film transistor on the substrate;
forming a first passivation layer on the thin film transistor and the substrate;
forming a via in the first passivation layer to expose a drain electrode of the thin film transistor;
forming a pixel electrode on the first passivation layer on the substrate, wherein the pixel electrode has a plurality of first through holes and is in contact with the drain electrode of the thin film transistor by the via;

forming a second passivation layer on the first passivation layer and the pixel electrode, and the second passivation layer fills the first through hole;

forming a common electrode on the second passivation layer on the pixel electrode, wherein the common electrode has a plurality of second through holes and is contacted with and not covered by the second passivation layer, and the first through hole and the second through hole is staggered disposed; and etching and removing the second passivation layer on the thin film transistor and the second passivation layer exposed by the second through hole.

6. The method of fabricating an array substrate according to claim 5, wherein the method of forming the thin film transistor on the substrate comprising:
forming a gate electrode on the substrate;
forming a gate insulating layer on the substrate and the gate electrode; wherein the first passivation layer on the substrate is located on the gate insulating layer of the substrate;
forming an active layer on the gate insulating layer on the gate electrode;
forming a first N-type conductive layer and a second N-type conductive layer on the active layer and to be spaced from each other; and
forming a source electrode and the drain electrode on the first N-type conductive layer and the second N-type conductive layer respectively, the source electrode and the drain electrode are in contact with the active layer, and the source electrode and the drain electrode are both extending to the gate insulating layer, respectively.

7. A method of fabricating an array substrate, comprising:
providing a substrate;
forming a thin film transistor on the substrate;
forming a pixel electrode on the substrate, wherein the pixel electrode is in contact with a drain electrode of the thin film transistor;
forming a passivation layer on the thin film transistor and the pixel electrode;
forming a common electrode on the passivation layer on the pixel electrode, wherein the common electrode has a plurality of second through holes and projection of the common electrode is overlapped with the pixel electrode; and
etching and removing a portion of the passivation layer on the thin film transistor and a portion of the passivation layer exposed by the second through hole.

8. The method of fabricating an array substrate according to claim 7, wherein the method of forming the thin film transistor on the substrate comprising:
forming a gate electrode on the substrate;
forming a gate insulating layer on the substrate and the gate electrode; wherein the pixel electrode on the substrate is located on the gate insulating layer of the substrate;
forming an active layer on the gate insulating layer on the gate electrode;
forming a first N-type conductive layer and a second N-type conductive layer on the active layer and to be spaced from each other; and
forming a source electrode and the drain electrode on the first N-type conductive layer and the second N-type conductive layer respectively, the source electrode and the drain electrode are in contact with the active layer, and the source electrode and the drain electrode are both extending to the gate insulating layer, respectively.

* * * * *